United States Patent
Kula et al.

(10) Patent No.: US 6,700,754 B2
(45) Date of Patent: Mar. 2, 2004

(54) OXIDIZED COPPER (CU) SPACER BETWEEN FREE AND PINNED LAYER FOR HIGH PERFORMANCE SPIN VALVE APPLICATIONS

(75) Inventors: Witold Kula, Cupertino, CA (US); Alexander Zeltser, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 09/846,735

(22) Filed: Apr. 30, 2001

(65) Prior Publication Data

US 2003/0021071 A1 Jan. 30, 2003

(51) Int. Cl.$^7$ .................................................. G11B 5/39
(52) U.S. Cl. .................................................. 360/324.1
(58) Field of Search ..................... 360/324.1, 324.11, 360/324.12, 324.2

(56) References Cited

U.S. PATENT DOCUMENTS

| | | | |
|---|---|---|---|
| 5,390,061 A | * 2/1995 | Nakatani et al. | 360/324.2 |
| 5,648,885 A | 7/1997 | Nishioka et al. | 360/113 |
| 5,793,207 A | 8/1998 | Gill | 324/252 |
| 5,793,279 A | 8/1998 | Nepela | 338/32 R |
| 5,828,531 A | 10/1998 | Gill | 360/113 |
| 5,828,598 A | 10/1998 | Chen et al. | 365/158 |
| 5,869,963 A | 2/1999 | Saito et al. | 324/252 |
| 5,880,913 A | 3/1999 | Gill | 360/113 |
| 5,898,612 A | 4/1999 | Chen et al. | 365/158 |
| 5,955,211 A | 9/1999 | Maeda et al. | 428/692 |
| 5,968,676 A | 10/1999 | Araki et al. | 428/692 |
| 5,993,566 A | 11/1999 | Lin | 148/108 |
| 6,108,177 A | * 8/2000 | Gill | 360/324.2 |
| 6,178,074 B1 | * 1/2001 | Gill | 360/324.2 |
| 6,275,363 B1 | * 8/2001 | Gill | 360/324.2 |
| 6,452,761 B1 | * 9/2002 | Carey et al. | 360/320 |
| 2002/0054463 A1 | * 5/2002 | Mukoyama et al. | 360/324.11 |

\* cited by examiner

*Primary Examiner*—Craig A. Renner
(74) *Attorney, Agent, or Firm*—Silicon Valley IP Group, PC; Dominic M. Kotab

(57) ABSTRACT

A spin valve sensor system and method for fabricating the same is provided. Included is a free layer and a pinned layer with a spacer layer disposed between the free layer and the pinned layer. Such spacer layer is oxidized for improving operational characteristics of the spin valve sensor.

21 Claims, 8 Drawing Sheets

OXIDIZED COPPER (CU) SPACER BETWEEN FREE AND PINNED LAYER FOR HIGH PERFORMANCE SPIN VALVE APPLICATIONS

FIELD OF THE INVENTION

The present invention relates to magnetoresistive read sensors for reading signals recorded in a magnetic medium, and more particularly, this invention relates to tailoring a spacer of a spin valve magnetoresistive read sensor for improving operating characteristics.

BACKGROUND OF THE INVENTION

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect (SV effect). In an spin valve sensor, one of the ferromagnetic layers, referred to as the pinned layer, has its magnetization typically pinned by exchange coupling with an antiferromagnetic (e.g., NiO, FeMn, PtMn) layer. The magnetization of the other ferromagnetic layer, referred to as the free layer, however, is not fixed and is free to rotate in response to the field from the recorded magnetic medium (the signal field). In spin valve sensors, the spin valve effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the spin valve sensor and a corresponding change in the sensed current or voltage. It should be noted that the AMR effect is also present in the spin valve sensor free layer.

FIG. 1 shows a typical spin valve sensor 100 (not drawn to scale) comprising end regions 104 and 106 separated by a central region 102. The central region 102 has defined edges and the end regions are contiguous with and abut the edges of the central region. A free layer (free ferromagnetic layer) 110 is separated from a pinned layer (pinned ferromagnetic layer) 120 by a non-magnetic, electrically-conducting spacer 115.

The spacer layer 115 separating magnetic free layer 110 and pinned layer 120 is critical for the performance of any type of spin valve device. Variety of spacer materials have been evaluated in the past, and copper (Cu) is commonly accepted as leading to the best spin valve characteristics, and is commonly used in device applications.

The magnetization of the pinned layer 120 is fixed through exchange coupling with an antiferromagnetic (AFM) layer 125. Free layer 110, spacer 115, pinned layer 120 and the AFM layer 125 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensor 170 is connected to leads 140 and 145 senses the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the spin valve effect.

Another type of spin valve sensor is an anti-parallel (AP)-pinned spin valve sensor. FIG. 2A shows an exemplary AP-Pinned spin valve sensor 200 (not drawn to scale). Spin valve sensor 200 has end regions 202 and 204 separated from each other by a central region 206. AP-pinned spin valve sensor 200 comprises a Ni-Fe free layer 225 separated from a laminated AP-pinned layer 210 by a copper spacer layer 220. The magnetization of the laminated AP-pinned layer 210 is fixed by an AFM layer 208, or pinning layer, which is made of NiO. The laminated AP-pinned layer 210 includes a first ferromagnetic layer 212 (PF1) of cobalt and a second ferromagnetic layer 216 (PF2) of cobalt separated from each other by a ruthenium (Ru) anti-parallel coupling layer 214. The AMF layer 208, AP-pinned layer 210, copper spacer 220, free layer 225 and a cap layer 230 are all formed sequentially in the central region 206. Hard bias layers 235 and 240, formed in end regions 202 and 204, provides longitudinal biasing for the free layer 225. Electrical leads 245 and 250 are also formed in end regions 202 and 204, respectively, to provide electrical current from a current source (not shown) to the spin valve sensor 200.

Various parameters of a spin valve sensor may be used to evaluate the performance thereof. For example, the structure sheet resistance (R), GMR ratio (ΔR/R), and ferromagnetic interlayer coupling field ($H_f$) are all performance indicators.

R and ΔR/R

Spin valve effects are characterized by ΔR/R, which is defined as $(R_{AP}-R_P)/R_P$, where $R_{AP}$ is the anti-parallel resistance and $R_P$ is the parallel resistance.

Numerous theoretical studies have attempted to explain the behavior of spin valve effects. However, there does not currently exist an explanation of the main factors controlling the magnitude of the sensor response, as characterized by $\Delta R/R$, as it relates to the required properties of the conductive spacers and ferromagnetic (FM) layers constituting such device. Experimental efforts have been largely based on trial and error, by investigating various combinations of FM layers and conductive spacer layers. None of the previous work has yielded quantitative guidelines for the maximization of $\Delta R/R$ for spin valve sensors by providing selection criteria for the layer compositions of the FM material and the conductive spacer.

What is known is that the GMR effect depends on the angle between the magnetizations of the free and pinned layers. More specifically, the GMR effect is proportional to the cosine of the angle B between the magnetization vector of the pinned layer ($M_p$) and the magnetization vector of the free layer ($M_F$) (Note FIGS. 2B and 2C). In a spin valve sensor, the electron scattering and therefore the resistance is maximum when the magnetizations of the pinned and free layers are antiparallel, i.e., majority of the electrons are scattered as they try to cross the boundary between the MR layers. On the other hand, electron scattering and therefore the resistance is minimum when the magnetizations of the pinned and free layers are parallel; i.e., majority of electrons are not scattered as they try to cross the boundary between the MR layers.

In other words, there is a net change in resistance of a spin valve sensor between parallel and antiparallel magnetization orientations of the pinned and free layers. The GMR effect, i.e., the net change in resistance, exhibited by a typical prior art spin valve sensor is about 6% to 8%.

During the design of a spin valve sensor, the thickness of the spacer layer is traditionally chosen to be less than the mean free path of conduction electrons through the spin valve sensor. With this arrangement, a portion of the conduction electrons are scattered by the interfaces of the spacer layer with the pinned and free layers. As mentioned earlier, changes in the scattering of the conduction electrons change the resistance of the spin valve sensor in proportion to cos $\theta$, where $\theta$ is the angle between the magnetizations of the pinned and free layers.

$H_f$

Because of a magnetic coupling between the free and pinned layers, there is an interlayer coupling field $H_f$ between the free and pinned layers. Since the spacer layer of a spin valve sensor affects the magnetic coupling between the free and pinned layers, it also affects $H_f$ and can thus be modified to minimize the same.

There is therefore a need for an improved spacer in a spin valve sensor that alters R, $\Delta R/R$, and $H_f$ for overall improved performance.

DISCLOSURE OF THE INVENTION

It is an object of the present invention to disclose an improved spin valve sensor that alters R and $\Delta R/R$ for overall improved performance.

It is another object of the present invention to disclose an improved spin valve sensor that alters $H_f$ for overall improved performance.

It is yet another object of the present invention to disclose an improved spin valve sensor with a spacer layer comprising $CuO_x$.

It is still yet another object of the present invention to disclose a method of fabricating an improved spin valve sensor with a spacer layer comprising $CuO_x$.

These and other objects and advantages are attained in accordance with the principles of the present invention by disclosing a spin valve sensor system and method for fabricating the same. Included is a free layer and a pinned layer with a spacer layer disposed between the free layer and the pinned layer. Such spacer layer is oxidized for improving operational characteristics of the spin valve sensor.

In one embodiment of the present invention, the spacer layer may include $CuO_x$. Further, the characteristics that are improved by the oxidation may include R, $\Delta R/R$, and/or $H_f$.

In another embodiment of the present invention, the spacer layer may be constructed utilizing physical vapor deposition (PVD) sputtering. Moreover, the spacer layer may be oxidized utilizing in-situ post-oxidation, reactive sputtering in oxygen, or a combination thereof. In the case of in-situ post-oxidation, the spacer layer may be oxidized in an environment characterized between 1E-4 and 1E-2 Torr*min. In the case of reactive sputtering, the spacer layer may be oxidized in an environment characterized between $5 \times 10^{-8}$ and $5 \times 10^{-7}$ Torr.

In any case, the spacer layer may be oxidized during and/or after being constructed. Further, the spacer layer may comprise a plurality of oxidized sub-layers. It should be noted that the spin valve sensor may take any form such as a top spin valve, a bottom spin valve, a dual spin valve, and/or an anti-parallel (AP)-pinned spin valve sensor.

In another aspect of the present invention, a method may be provided for fabricating the spin valve sensor. During such method for a bottom spin valve, a pinned layer is deposited, and a spacer layer deposited on the pinned layer. Further, a free layer is deposited on the spacer layer. As set forth earlier, the spacer layer is oxidized for improving operational characteristics of the spin valve sensor.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIGS. 5B-1, 2, 3, 4 and 5 show various exemplary embodiments regarding the manner in which the Cu of the spacer layer may be oxidized in accordance with the present invention.

DESCRIPTION OF THE PREFERRED EMBODIMENTS

The following description is the best embodiment presently contemplated for carrying out the present invention.

This description is made for the purpose of illustrating the general principles of the present invention and is not meant to limit the inventive concepts claimed herein.

Figure 3:
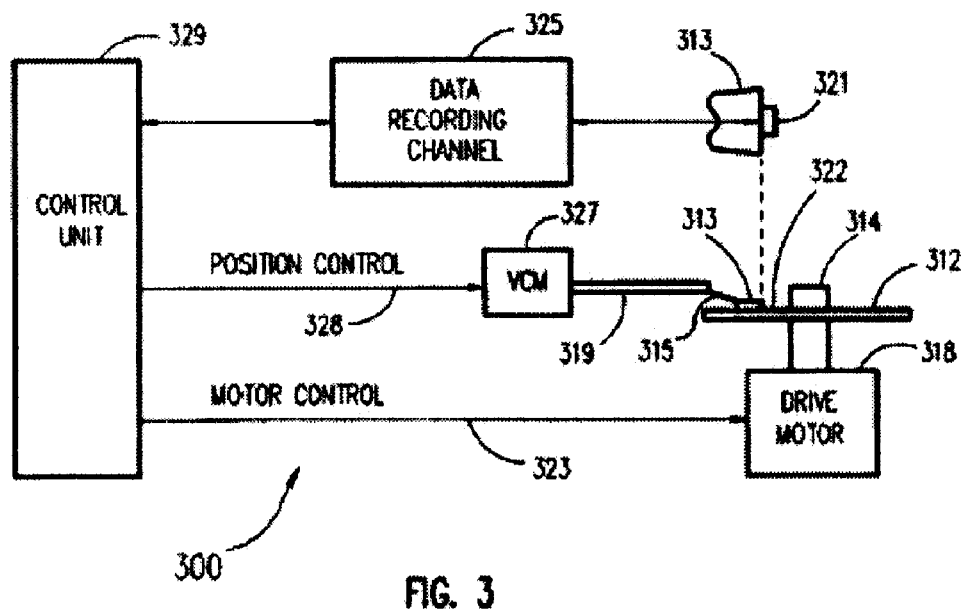
FIG. 3 is a perspective drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data are recorded. Each slider 313 is attached to an actuator arm 319 by way of a suspension 315. The suspension 315 provides a slight spring force which biases slider 313 against the disk surface 322. Each actuator arm 319 is attached to an actuator 327. The actuator 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a magnetic disk storage system of the present invention, and the accompanying illustration of FIG. 3 are for representation purposes only. It should be apparent that disk storage systems may contain a large number of disks and actuators, and each actuator may support a number of sliders.

Figure 4:
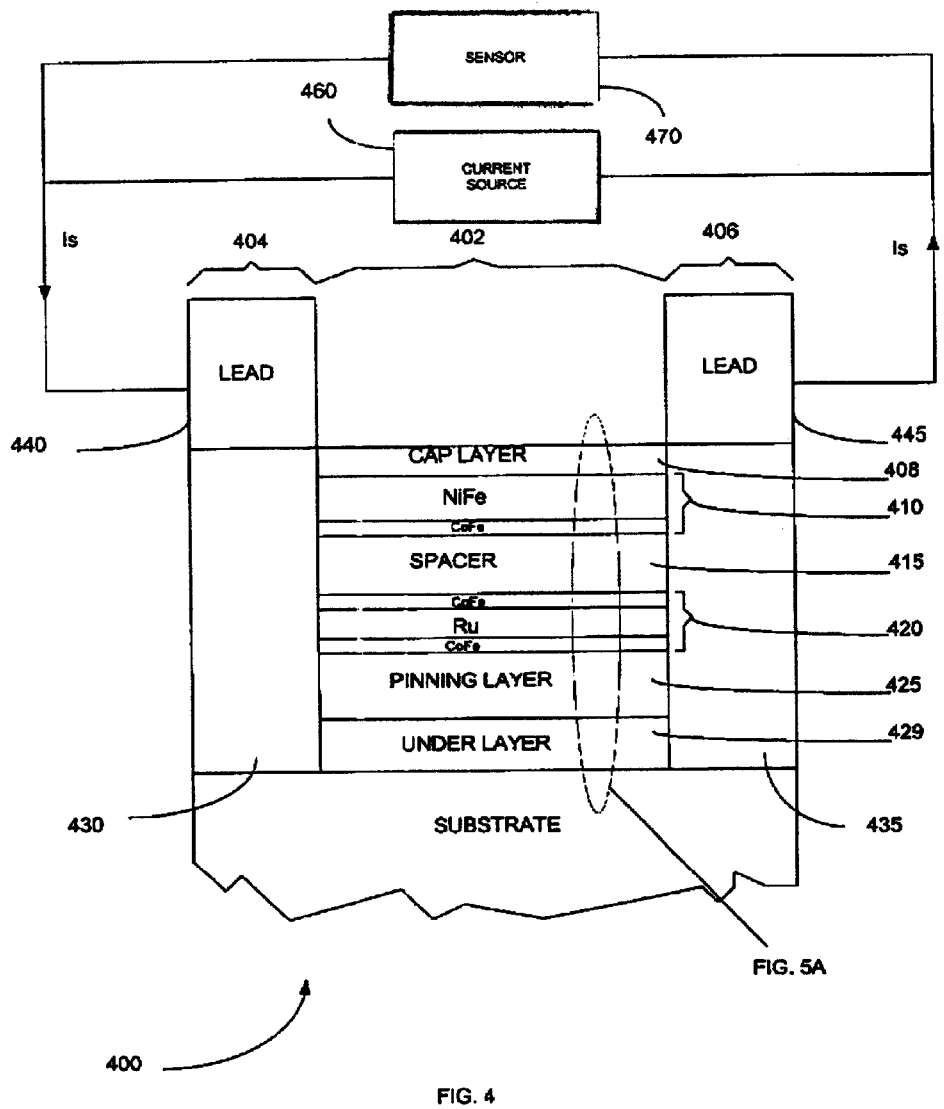
FIG. 4 is a schematic diagram of the cross-section of the preferred spin valve sensor of the present invention.

Now referring to FIG. 4, there is shown an air bearing surface (ABS) view of the spin valve sensor 400 (not drawn to scale) having the structure of Underlayer/PtMn/CoFe/Ru/CoFe/Spacer/CoFe/NiFe/Ta and manufactured, using a sputter deposition process, according to the preferred embodiment of the present invention. Spin valve sensor 400 comprises end regions 404 and 406 separated by a central region 402. A free layer (free ferromagnetic layer) 410, comprising a NiFe layer and/or a thin CoFe layer, is separated from a pinned layer (pinned ferromagnetic layer) 420, comprising a Ru layer and two thin CoFe layers, by a non-magnetic, electrically-conducting spacer layer 415.

Such electrically-conducting spacer layer 415 may be constructed from copper, Cu. In a preferred embodiment of the present invention, such copper spacer layer 415 is oxidized in order to improve operational characteristics. More information regarding such improvement will be set forth in greater detail during reference to FIGS. 5–7.

The magnetization of the pinned layer 420 is fixed by an antiferromagnetic (AFM) layer 425. An underlayer 429, AFM layer 425, pinned layer 420, spacer layer 415, free layer 410, and a cap layer 408 are all formed in that order in the central region 402. The underlayer 429 or seed layer is any layer(s) deposited to modify the crystallographic texture or grain size of the subsequent layers, and may not be needed depending on the substrate.

Referring to FIG. 4, the spin valve sensor 400 further comprises layers 430 and 435 formed in the end regions 404 and 406, respectively, for providing a longitudinal bias field to the free layer 410 to ensure a single magnetic domain state in the free layer 410. Layers 430 and 435, preferably made of hard magnetic material such as CoPtCr, are deposited and magnetically aligned at room temperature according to the well known methods established in the prior art. Lead layers 440 and 445 are formed over hard bias layers 430 and 435 in the end regions 404 and 406, respectively, by the methods known in the prior art.

Leads 440 and 445 provide electrical connections for the flow of the sensing current $I_s$ from a current source 460 to the spin valve sensor 400. The sensor 470 is connected to leads 440 and 445 senses the change in the resistance due to changes induced in the free layer 410 by the external magnetic field (e.g., field generated by a data bit stored on a disk).

The above description of a spin valve sensor of the present invention, and the accompanying illustration of FIG. 4 are for representation purposes only. It should be apparent that spin valve sensors may contain differing layers of varying materials for accomplishing similar results. Moreover, the spin valve sensor may include a top spin valve, a bottom spin valve, a dual spin valve, and/or any other type of spin valve per the desires of the user.

Figure 5A:
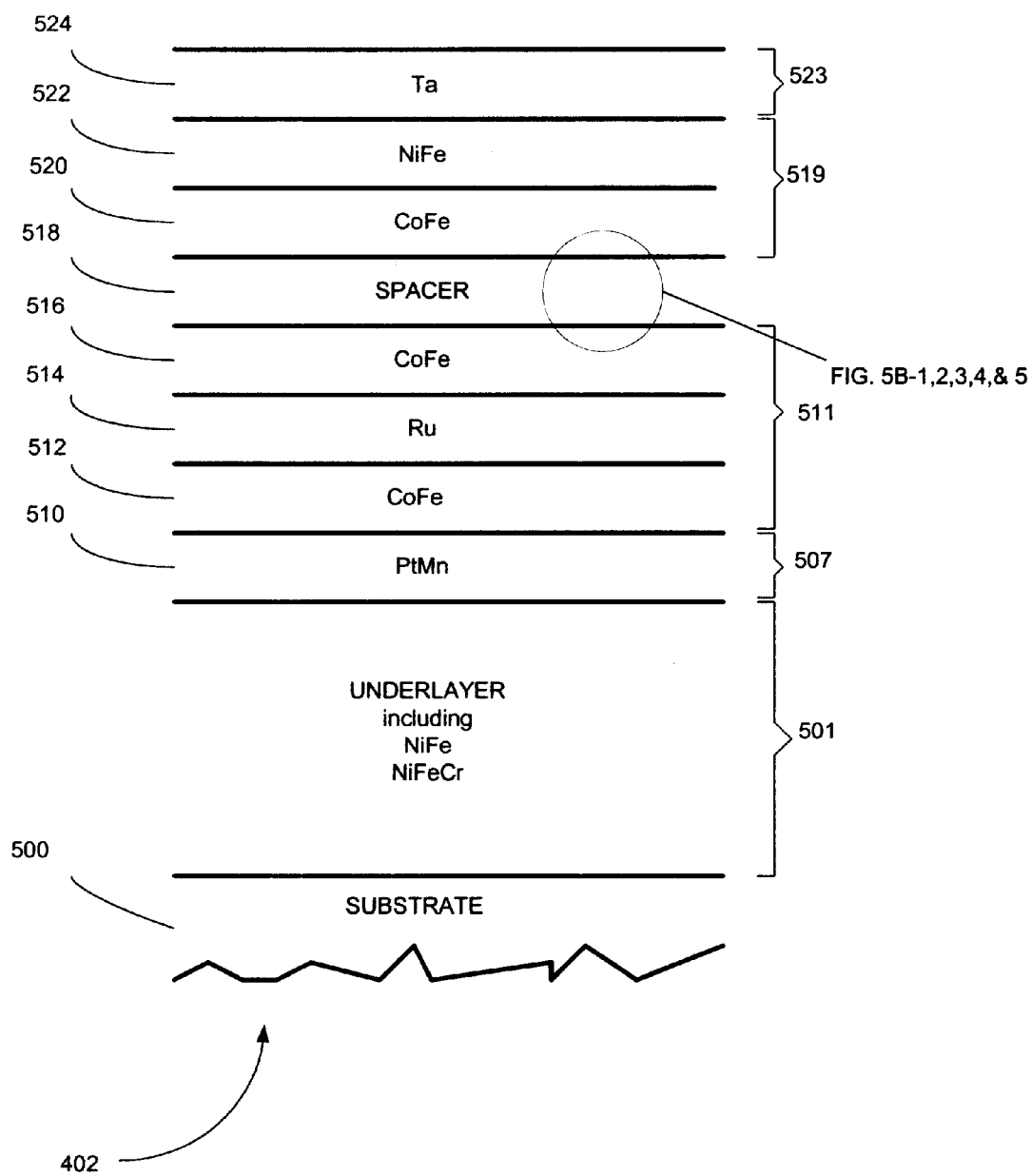
FIG. 5A is a schematic diagram of the cross-section of a thin film structure in accordance with the preferred embodiment of the present invention.

Referring now to FIG. 5A, the sputter deposition process for fabrication of the central region 402 of FIG. 4 of spin valve sensor 400 is shown (not to scale) with deposition on a substrate 500 of suitable underlayer 501 materials including NiFeCr and NiFe. Thereafter, an antiferromagnetic (AFM) pinning layer 507 is deposited. The preferred composition of the AFM layer 507 is a PtMn composition 510. It should be noted that, in the present description, the notation "PtMn" (or any other combination of materials) refers to any desirable amount of either materials, i.e. Pt—Mn. A pinned layer 511 is subsequently deposited in direct contact and overlaying the pinning layer 507. The pinned layer 511 includes a CoFe layer 512 followed by a Ru layer 514 and another CoFe layer 516.

Following the pinned layer 511, a spacer layer 518 is deposited. As mentioned hereinabove, the spacer layer 518 includes Cu. While such Cu may be deposited in any desired manner, physical vapor deposition (PVD) sputtering may be utilized in one embodiment. PVD sputtering is commonly used for depositing metal films and the like onto substrate surfaces. A planar target is typically positioned within a chamber, in spaced apart and symmetrical counterfacing relation with the substrate. The target is made of the material that is to be sputter deposited onto the substrate surface. Emission-inducing energy is applied to the active face of the target in the form, for example, of a plasma containing accelerated argon ions. In response to such bombardment, the active face of the target emits small particles composed of the target material. The emitted particles follow a generally linear trajectory from their point of emission on the target surface to a collision point on the counterfacing surface of the substrate. Physical adhesion mechanisms cause the target particles to bond to the surface of the substrate.

Also mentioned earlier is the fact that the spacer layer 518 includes oxidized Cu, or $CuO_x$. It should be noted that the Cu may be oxidized using any desired method. For example, the oxidized Cu spacer may be incorporated into a spin valve stack by in-situ intra-deposition and/or post-deposition oxidation of a Cu metal layer. Oxidation can be applied to a whole spacer layer or only a part of it (thickness-wise), with the magnitude of observed effects roughly scaling with the fraction of oxidized material built into the structure. The term "in-situ" is often used since the substrate never leaves the vacuum of one machine. In the case of in-situ sputtering, the spacer layer may be oxidized in an environment characterized between 1E-4 and 1E-2 Torr*min.

In another embodiment, reactive sputtering may be carried out in atmosphere with oxygen background. In the case of reactive sputtering, the spacer layer 518 may be oxidized in an environment characterized between $5 \times 10^{-8}$ and $5 \times 10^{-7}$ Torr. It should be noted that the spacer layer 518 may be oxidized utilizing in-situ post-oxidation, reactive sputtering, or a combination thereof. Additional information regarding exemplary methods of oxidizing the spacer layer 518 will be set forth in greater detail during reference to FIGS. 5B-1, 2, 3, 4 and 5.

In one embodiment, the free layer 519 comprises a CoFe layer 520 and/or a NiFe layer 522. The cap layer 523 may include a Ta composition 524. This completes processing of the central region of the spin valve structure of the preferred embodiment of the present invention.

After the formation of the central region of the spin valve sensor has been completed, end regions are formed which include depositing horizontal bias layers and leads according to the well known methods established in the prior art.

The above description of a spin valve sensor structure of the present invention, and the accompanying illustration of FIG. 5A are for representation purposes only. Such spin valve sensor structure is that which was used to produce the analysis data set forth hereinbelow. Such data shows improvements associated with applying the principles of the improved spacer of the present invention. It should be noted, however, that other spin valve sensor structures including differing layers of varying materials may be employed while still achieving improvements unique to the improved spacer.

Figure 1:
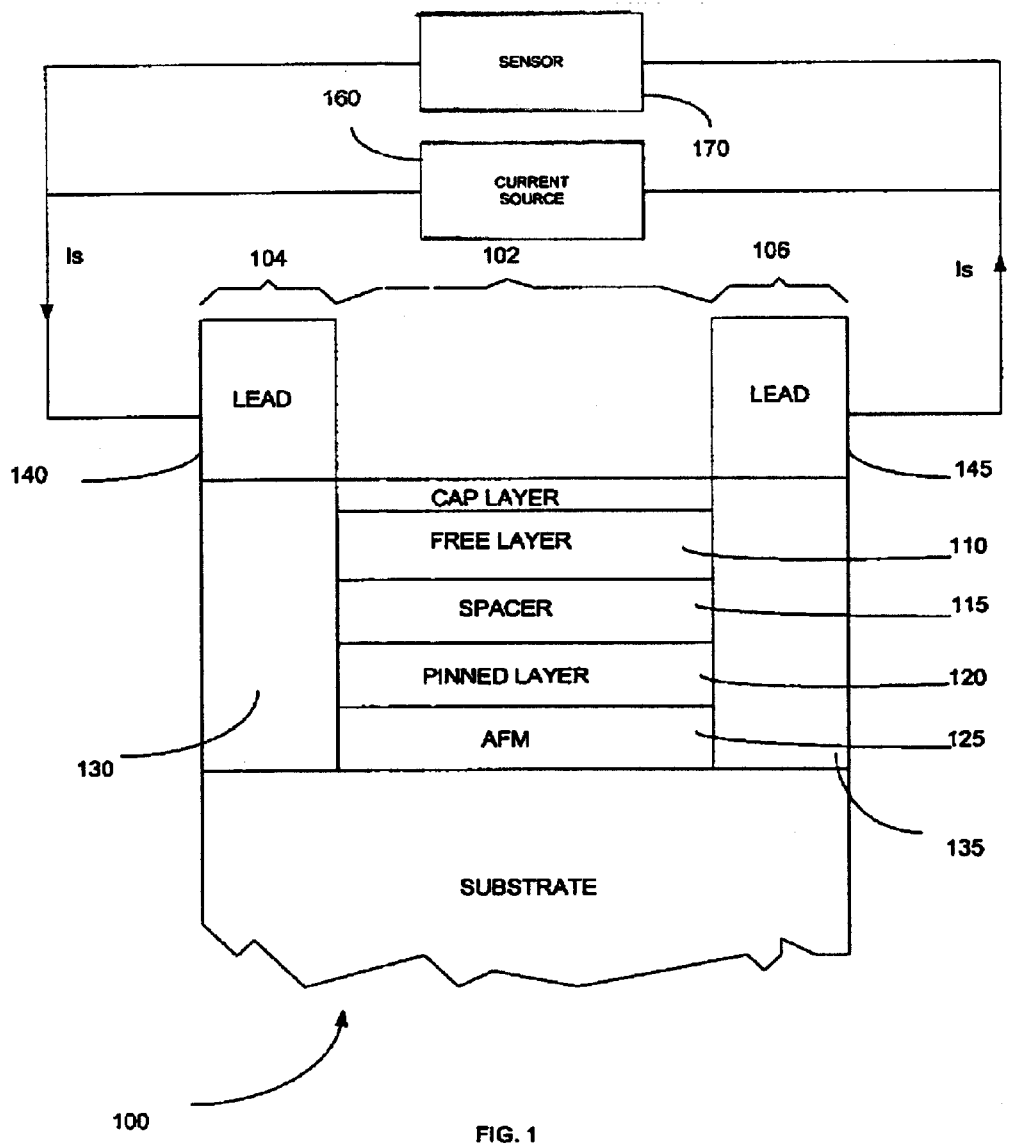
FIG. 1 is a schematic diagram of the cross-section of a prior art spin valve sensor.
Figure 2A:
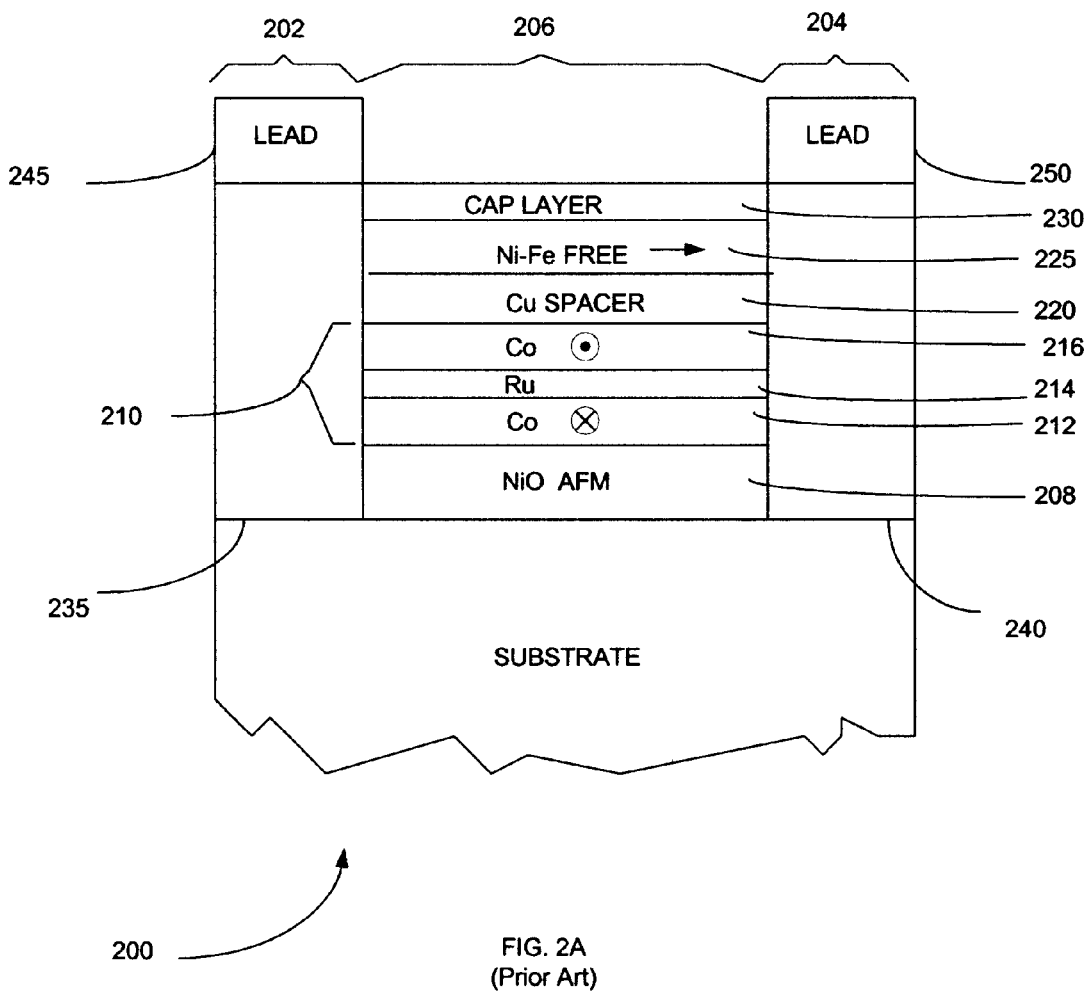
FIG. 2A shows an AP-Pinned spin valve sensor in accordance with the prior art.
Figure 2B:
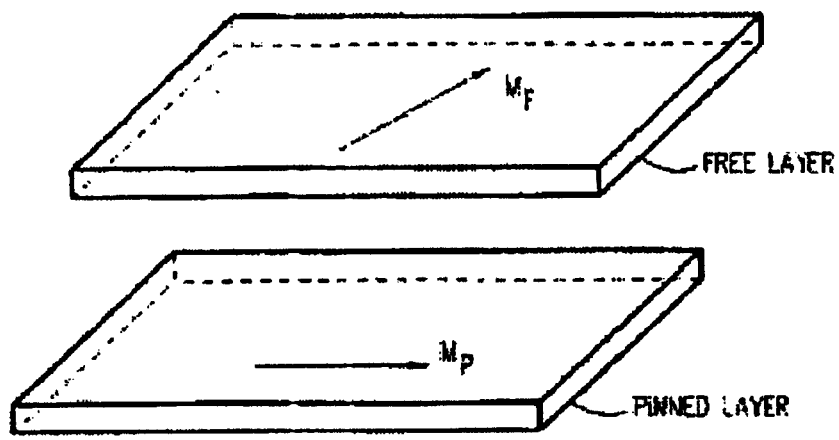
FIGS. 2B and 2C illustrate a perspective of the free and pinned layers, and a diagram of the magnetization vectors, respectively, of a prior art spin valve sensor.
Figure 2C:
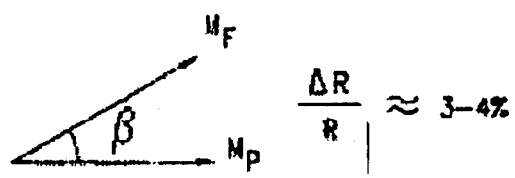
Figures 1, 5B:
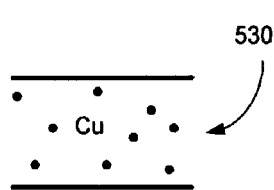

FIGS. 5B-1, 2, 3, 4 and 5 show various exemplary embodiments (not drawn to scale) regarding the manner in which the Cu of the spacer layer 518 may be oxidized. As shown in FIG. 5B-1, a first embodiment 530 is shown where the Cu of the spacer layer is oxidized during deposition. Resulting is the formation of CuOx amorphous phase as deposited film.

Figures 2, 5B:
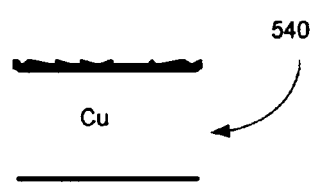
Figures 3, 5B:
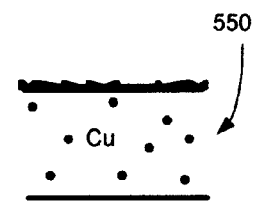
Figures 4, 5B:
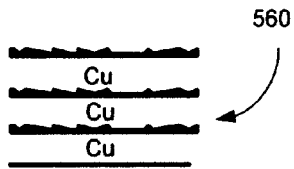

FIG. 5B-2 illustrates a second embodiment 540 where the Cu of the spacer layer is oxidized after the Cu is deposited. As shown, the oxidation takes place on an upper surface of the spacer layer. FIG. 5B-3 shows the result of combining the approaches of FIGS. 5B-1 and 5B-2 in a third embodiment 550.

Figures 5, 5B:
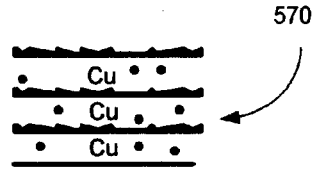

With reference now to FIG. 5B-4, a fourth embodiment 560 is shown with a plurality of stacked sub-layers of Cu that are oxidized in the manner set forth in the second embodiment 540 of FIG. 5B-2. Finally, a fifth embodiment 570 is shown in FIG. 5B-5 wherein a plurality of stacked sub-layers of Cu that are oxidized in the manner set forth in the first and second embodiments 530, 540 of FIG. 5B-1 and 5B-2, respectively. It should be noted that the foregoing exemplary embodiments are for illustrative purposes only, and that any desired method may be used to afford the spacer layer constructed at least in part with $CuO_x$.

It has been demonstrated that using a spacer made of $CuO_x$, with a controlled oxidation profile and oxidation level x, leads to spin valve characteristics that are substantially superior to those obtained with a Cu metal spacer. In addition, such spin valve characteristics may be tunable. With the modified spacer layer, an increase in $\Delta R/R$ from 10.6% to 12.2% or more is exhibited, along with a lowering of interlayer coupling $H_f$ from ferromagnetic to antiferromagnetic.

Further, a controlled increase in structure sheet resistance, R, up to 3 Ohm/sq. or more was obtained in device-quality AP-pinned PtMn spin valves designed for the next generation recording heads. An example of such next generation recording heads is the IBM GMR 5.5 series record head. To this end, a 40% increase has been accomplished in the figure of merit $\Delta R = R \times \Delta R/R$. It is well known that these improvements are vital for higher amplitude and better overall performance of advanced spin valve sensors.

Table 1 shows the giant magnetoresistive (GMR) coefficients ($\Delta R/R$), structure sheet resistances (R), and interlayer couplings ($H_f$) for the prior art and present invention spin valve structures taken from FIG. 5A. The significantly higher GMR coefficients of the present invention spin valve sensor demonstrate that the use of a spacer comprising $CuO_x$, results in improved spin valve sensor performance.

TABLE 1

| | R · Ω/sq | Hce, Oe | Hf, Oe | ΔR/R % | Dr [R × (ΔR/R)], Ω/sq |
|---|---|---|---|---|---|
| Cu spacer layer | 14.6 | 4.7 | 9.4 | 10.64 | 1.55 |
| CuOx spacer layer | 17.7 | 4.6 | −6.7 | 12.24 | 2.17 |
| CuOx spacer layer-optimized embodiment | 18.3 | | −3.6 | 13.3% | 2.4 |

Figure 6:
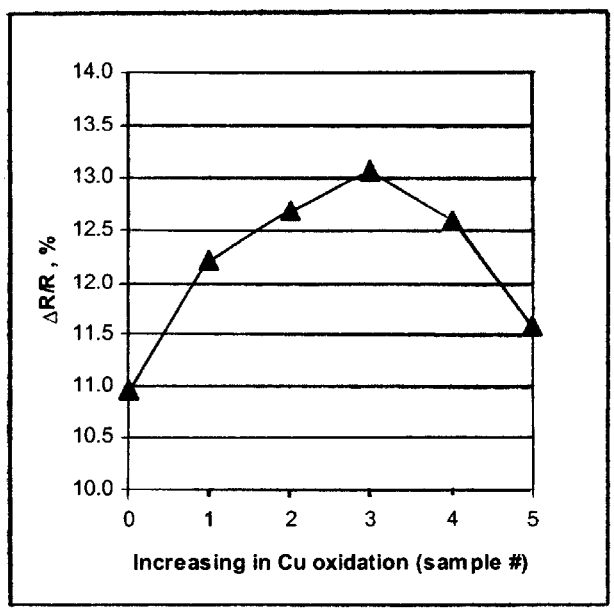
FIGS. 6 and 7 illustrate an exemplary comparison of optimized spin valve characteristics without Cu oxidation and with an increasing degree of Cu oxidation.
Figure 7:
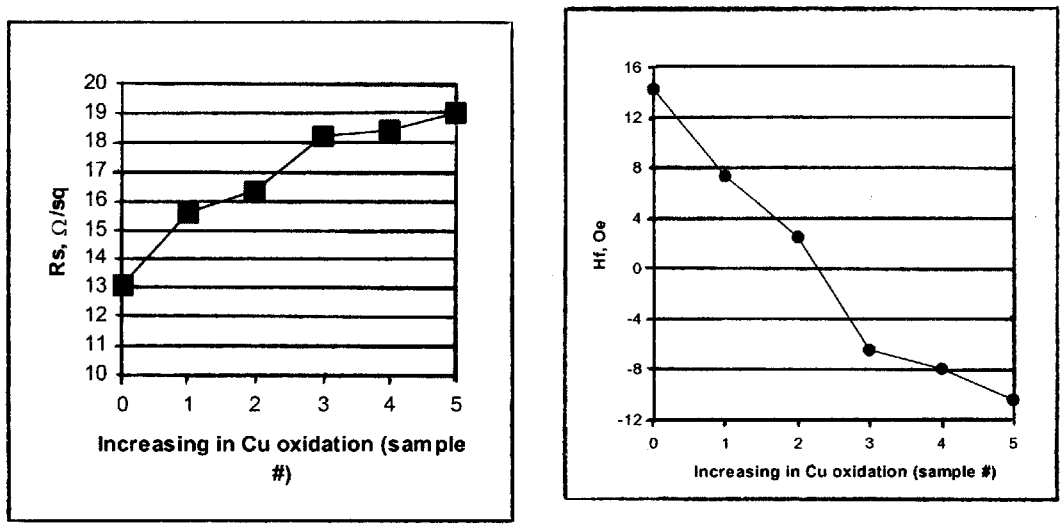

FIGS. 6 and 7 illustrate an exemplary comparison of optimized spin valve characteristics without Cu oxidation (see sample #1) and with increasing degrees of Cu oxidation (see samples #2 through #4). As shown in Table 1 and FIGS. 6 and 7, significant improvement of all critical spin valve characteristics is exhibited, with the overall increase in the figure of merit AR from 1.55 Ohm/sq. to 2.17 Ohm/sq or higher. (40% increase). The improvement results from both direct and indirect oxidation-related effects associated with the oxidized Cu spacer layer. A direct increase in $\Delta R/R$ and R, and decrease in $H_f$ is induced by oxidation-related changes in spin valve microchemistry and microstructure.

An additional increase in $\Delta R/R$ and R may also be gained due to the application of a thinner $CuO_x$ spacer. It should be noted that the reduction of a thickness of the $CuO_x$ spacer is made possible by lower $H_f$. This additional increase in $\Delta R/R$ and R is thus afforded indirectly.

An increase in $\Delta R/R$ and decrease in $H_f$ are observed at even very low levels of Cu oxidation. Such levels may not necessarily even be directly detectable in approx. 2 nm thick spacer layer by analytical techniques. An increase in R appears at higher oxidation levels and seems to be at least in part related to the increase in bulk resistivity of the $CuO_x$ material. Table 2 shows the increase in bulk resistivity measured in single $CuO_x$ films reactively sputtered at various levels of oxygen background.

TABLE 2

| % O2 | ρ, $\mu\Omega$cm |
|------|------|
| 0.00 | 3.6 |
| 1.20 | 686.5 |
| 3.6 | 5290.0 |
| 6.00 | 56954.5 |

Table 3 shows a correlation between increase in R of the spin valve structure (similar to that used in Table 1) and the level of oxygen background used during the $CuO_x$ spacer deposition. In particular, Table 3 shows the resistivity of $CuO_x$ in ~600 Å thick films reactively sputtered in Ar with various percentages of oxygen. It should be noted that the increase in R observed at higher oxidation levels is due at least in part to the increased resistivity of the $CuO_x$ material.

TABLE 3

| % O2 | R, $\Omega$/sq |
|------|------|
| 0.12 | 18.4 |
| 0.23 | 18.7 |
| 0.46 | 19.7 |

As will be apparent to one skilled in the art, the fabrication methods of the preferred embodiment and the alternative embodiments described herein may be used to fabricate spin valve sensors having any other layered structure, i.e. underlayer/pinned layer/spacer/free layer. Further, it should be noted that the various principles of the present invention may be applicable in a very broad range of spin valve sensor devices.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A spin valve sensor, comprising:
    a pinned layer having a pinned layer magnetization;
    a free layer disposed adjacent the pinned layer, the free layer having a free layer magnetization perpendicular to the pinned layer magnetization in the absence of an external field;
    a spacer layer disposed between the pinned layer and the free layer, wherein the spacer layer comprises Cu;
    wherein the spacer layer is oxidized for improving operational characteristics of the spin valve sensor.

2. The spin valve sensor as recited in claim 1, wherein the spacer layer comprises $CuO_x$.

3. The spin valve sensor as recited in claim 1, wherein the spacer layer is oxidized in an environment characterized between 1E-4 and 1E-2 Torr*min.

4. The spin valve sensor as recited in claim 1, wherein at least a portion of the spacer layer is oxidized, the at least a portion of the spacer layer having been oxidized utilizing in-situ post-oxidation.

5. The spin valve sensor as recited in claim 4, wherein the spacer layer has been oxidized in an environment characterized between 1E-4 and 1E-0.2 Torr*min.

6. The spin valve sensor as recited in claim 1, wherein the spacer layer is an amorphous film of $CuO_x$ formed by oxidation during sputtering thereof.

7. The spin valve sensor as recited in claim 1, wherein the spacer layer has a controlled oxidation profile formed by oxidation after sputtering thereof.

8. The spin valve sensor as recited in claim 1, wherein the spacer layer is constructed of a plurality of oxidized sublayers.

9. The spin valve sensor as recited in claim 1, wherein the spacer layer is oxidized utilizing reactive sputtering in oxygen.

10. The spin valve sensor as recited in claim 9, wherein the spacer layer is oxidized in an environment characterized between $5\times10^{-8}$ and $5\times10^{-7}$ Torr.

11. The spin valve sensor as recited in claim 1, wherein the pinned layer comprises a Ru layer.

12. The spin valve sensor as recited in claim 11, wherein the pinned layer further comprises a first CoFe layer disposed adjacent a first side of the Ru layer and a second CoFe layer disposed adjacent a second side of the Ru layer.

13. The spin valve sensor as recited in claim 1, wherein the free layer comprises a NiFe layer.

14. The spin valve sensor as recited in claim 13, wherein the free layer further comprises a CoFe layer disposed adjacent the NiFe layer.

15. A method for fabricating a spin valve sensor, comprising:
    depositing a pinned layer,
    depositing a spacer layer on the pinned layer, wherein the spacer layer comprises Cu; and
    depositing a free layer on the spacer layer, the free layer having a free layer magnetization perpendicular to the pinned layer magnetization in the absence of an external field;
    wherein the spacer layer is oxidized for improving operational characteristics of the spin valve sensor.

16. The method as recited in claim 15, wherein the spacer layer comprises $CuO_x$.

17. A spin valve sensor, comprising:
    a pinned layer having a pinned layer magnetization;
    a free layer disposed adjacent the pinned layer, the free layer having a free layer magnetization perpendicular to the pinned layer magnetization in the absence of an external field; and
    a spacer layer comprising Cu disposed between the pinned layer and the free layer, the spacer layer being oxidized to form $CuO_x$ for improving operational characteristics of the spin valve sensor;
    wherein the spacer layer is oxidized after sputtering thereof.

18. A spin valve sensor, comprising:
    a pinned layer having a pinned layer magnetization;
    a free layer disposed adjacent the pinned layer, the free layer having a free layer magnetization perpendicular to the pinned layer magnetization in the absence of an external field; and
    a spacer layer comprising Cu disposed between the pinned layer and the free layer, die spacer layer being oxidized to form $CuO_x$ for improving operational characteristics of the spin valve sensor;
    wherein the spacer layer is oxidized during sputtering thereof.

19. A spin valve sensor comprising:
    a pinned layer having a pinned layer magnetization, the pinned layer comprising a Ru layer with a first CoFe layer disposed adjacent a first side of the Ru layer and a second CoFe layer disposed adjacent a second side of the Ru layer;

a free layer disposed adjacent the pinned layer, the free layer having a free layer magnetization perpendicular to the pinned layer magnetization in the absence of an external field, the free layer comprising a NiFe layer with a third CoFe layer disposed adjacent thereto;

a spacer layer disposed between the free layer and the pinned layer, the spacer layer being oxidized to form $CuO_x$ for improving operational characteristics of the spin valve sensor;

a pinning layer disposed adjacent the pinned layer for fixing the pinned layer magnetization, the pinning layer comprising PtMn; and an underlayer disposed adjacent the pinning layer, the underlayer comprising NiFeCr.

20. A disk drive system, comprising:

a magnetic recording disk;

a spin valve sensor including:

a pinned layer having a pinned layer magnetization, a free layer disposed adjacent the pinned layer, the free layer having a free layer magnetization perpendicular to the pinned layer magnetization in the absence of an external field, and a spacer layer disposed between the pinned layer and the free layer, wherein the spacer layer comprises Cu, wherein the spacer layer is oxidized for improving operational characteristics of the spin valve sensor;

an actuator for moving the spin valve sensor across the magnetic recording disk so the spin valve sensor may access different regions of magnetically recorded data on the magnetic recording disk; and a controller electrically coupled to the spin valve sensor for detecting changes in resistance of the s in valve sensor.

21. The spin valve sensor as recited in claim 1, wherein the spacer layer is at least partially oxidized such that an increase in $\Delta R/R$ of at least 10.6% is observed over a spin valve sensor identical to the spin valve sensor of claim 1 except having a spacer layer that is not oxidized.

* * * * *

UNITED STATES PATENT AND TRADEMARK OFFICE
CERTIFICATE OF CORRECTION

PATENT NO. : 6,700,754 B2
DATED : March 2, 2004
INVENTOR(S) : Kula et al.

It is certified that error appears in the above-identified patent and that said Letters Patent is hereby corrected as shown below:

Column 9,
Line 64, change "1E-0.2" to -- 1 E-2 --;

Column 10,
Line 57, change "die" to -- the --;

Column 12,
Line 13, change "the s in valve" to -- the spin valve --.

Signed and Sealed this

Twenty-fourth Day of August, 2004

JON W. DUDAS
*Director of the United States Patent and Trademark Office*